United States Patent
Mereness

(10) Patent No.: US 6,636,679 B1
(45) Date of Patent: Oct. 21, 2003

(54) FIBER OPTIC CABLE SADDLE

(75) Inventor: Richard Ty Mereness, Columbia, MD (US)

(73) Assignee: Ciena Corporation, Linthicum, MD (US)

(*) Notice: Subject to any disclaimer, the term of this patent is extended or adjusted under 35 U.S.C. 154(b) by 0 days.

(21) Appl. No.: 09/938,390

(22) Filed: Aug. 24, 2001

Related U.S. Application Data

(60) Provisional application No. 60/286,126, filed on Apr. 24, 2001.

(51) Int. Cl.$^7$ .................................................. G02B 6/00
(52) U.S. Cl. ............................................................. 385/136
(58) Field of Search ........................... 385/100, 101, 385/102, 103, 104, 136, 147; 174/135; 248/74.3

(56) References Cited

U.S. PATENT DOCUMENTS

| | | | | |
|---|---|---|---|---|
| 3,515,363 A | * | 6/1970 | Fisher | 248/71 |
| 3,913,187 A | * | 10/1975 | Okuda | 24/255 |
| 4,274,612 A | * | 6/1981 | Massey | 248/74 |
| 4,371,137 A | * | 2/1983 | Anscher | 248/73 |
| 4,455,715 A | * | 6/1984 | Matsui | 24/16 |
| 4,564,163 A | * | 1/1986 | Barnett | 248/71 |
| 4,609,171 A | * | 9/1986 | Matsui | 248/74.3 |
| 5,367,750 A | * | 11/1994 | Ward | 24/16 |
| 5,921,510 A | * | 7/1999 | Benoit et al. | 248/71 |
| 5,937,488 A | * | 8/1999 | Geiger | 24/339 |
| 6,079,674 A | * | 6/2000 | Snyder | 248/74.3 |
| 6,164,605 A | * | 12/2000 | Drake et al. | 248/74.3 |
| 6,209,827 B1 | * | 4/2001 | Kawai | 248/73 |
| 6,443,403 B1 | * | 9/2002 | Page et al. | 248/71 |

* cited by examiner

Primary Examiner—Lynn Feild
Assistant Examiner—Thanh-Tam Le
(74) Attorney, Agent, or Firm—Michael R. Cammarata; James M. Olsen

(57) ABSTRACT

A fiber optic cable saddle for securing and routing fiber optic cables on a printed circuit board (PCB) or other component used in the communications field. The fiber optic cable saddle includes a body portion that may be connected to a post having a barb at one end. The saddle may be mounted in a PCB by forcing the barb in an opening provided in the PCB. The fiber optic cable saddle is formed from a soft, resilient material that permits the body portion to flex open and return back to its original shape. The profile of the body portion is a thin, closely spaced spiral. Each of the free ends of the body portion has a cylindrical projection integrally formed thereon. In a closed position of the saddle, the cylindrical projections are partially disposed within corresponding recesses formed in the body portion. Before securing the fiber optic cables within the saddle, a user will preferably mount the saddle on the PCB. Once the saddle is mounted on the PCB, the user opens the saddle by flexing a section of the body portion so that a space forms between the ends of the body portion. With the body portion in this open position, the user then places the fiber optic cables against the inner surface of the body portion, and then ceases flexure of the section of the body portion. This allows the saddle to relax and coil around the fiber optic cables, holding them in place. The fiber optic cable saddle is easy to use since it is self-closing and naturally wraps around the fiber optic cables when the user ceases flexure of the body portion. Furthermore, the saddle is soft and flexible so it does not damage the fiber optic cable contained therein.

19 Claims, 2 Drawing Sheets

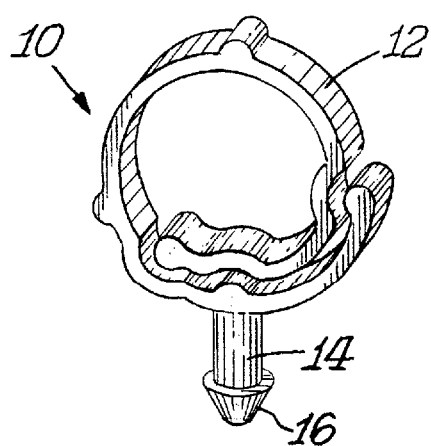
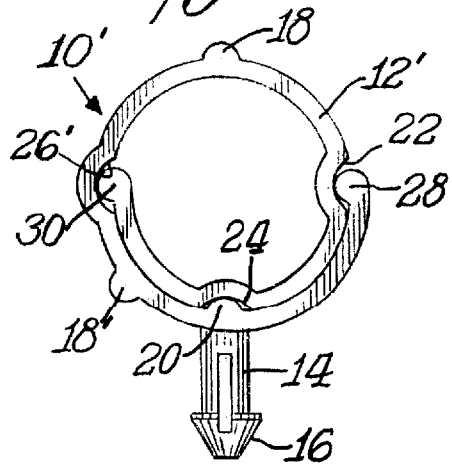
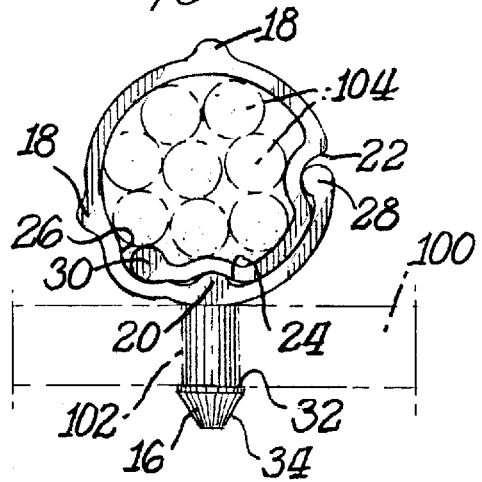
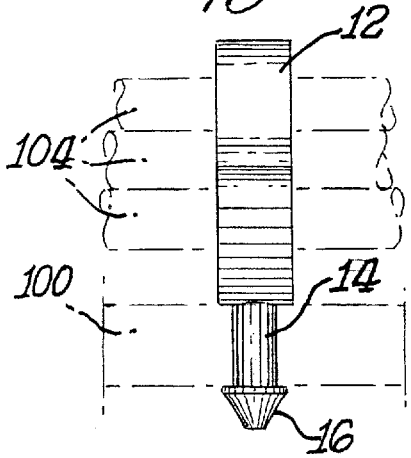

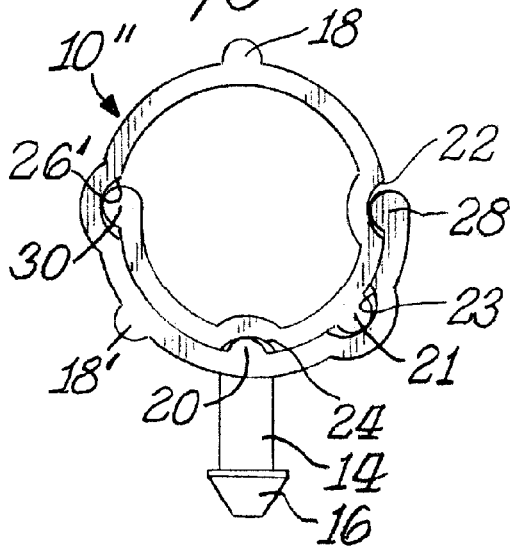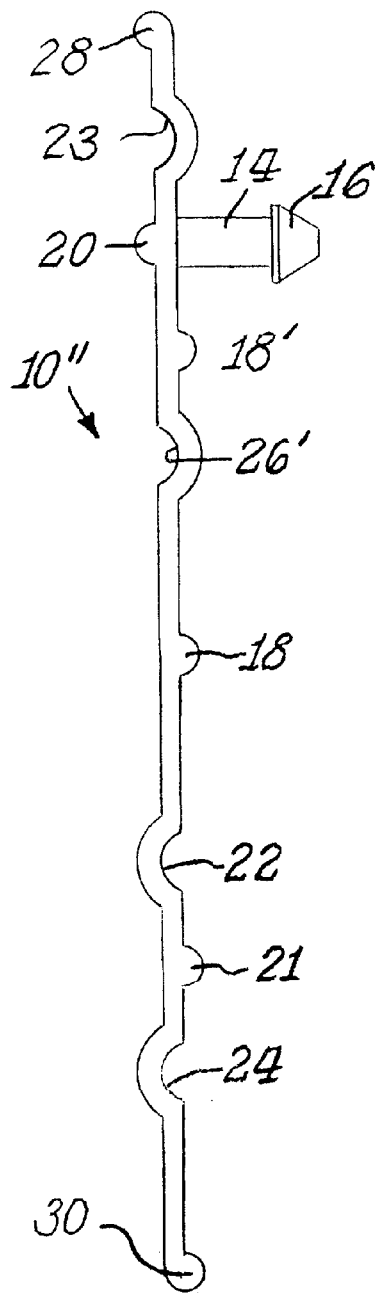

FIBER OPTIC CABLE SADDLE

CLAIM OF PRIORITY

Priority is claimed under 35 U.S.C. §119(e) from U.S. Provisional Application Serial No. 60/286,126, filed Apr. 24, 2001. The prior application is herein incorporated by reference in its entirety.

BACKGROUND OF THE INVENTION

A. Field of the Invention

The present invention relates generally to the communications field, and, more particularly to a fiber optic cable saddle for securing and routing fiber optic cables on a printed circuit board (PCB) or other component used in the communications field.

B. Description of the Related Art

Presently, it is a problem in the field of communication cable installation to ensure the precise placement of the communication cable without the possibility of damage to the communication cable by the provision of tight bends, or inappropriate use of fasteners, or inadequate support to the communication cable. Such communication cables include conventional telephone cable having a plurality of copper conductors, coaxial cable, optical fiber, or the like. In all of these applications, the minimum radius of curvature of the communication cable is well defined, and bending the communication cable in a tighter bend can cause damage to the communication medium housed within the cable. The installer of communication cable is thus faced with the problem of routing the communication cable over surfaces, which typically include sharp bends, without over bending the communication cable, yet also securing the communication cable to these surfaces in a manner to ensure protection from damage.

This problem is further heightened when fiber optic cables are used. Glass fibers used in such cables are easily damaged when bent too sharply and require a minimum bend radius to operate within required performance specifications. The minimum bend radius of a fiber optic cable depends upon a variety of factors, including the signal handled by the fiber optic cable, the style of the fiber optic cable, and equipment to which to fiber optic cable is connected. For example, some fiber optic cables used for internal routing have a minimum bend radius of 0.75 inches, and some fiber optic cables used for external routing have a minimum bend radius of 1.0 inches.

Damaged fiber optic cables may lead to a reduction in the signal transmission quality of the cables. Accordingly, fiber optic cables are evaluated to determine their minimum bend radius. As long as a fiber optic cable is bent at a radius that is equal to or greater than the minimum bend radius, there should be no reduction in the transmission quality of the cable. If a fiber optic cable is bent at a radius below the minimum bend radius determined for such cable, there is a potential for a reduction in signal transmission quality through the bend. The greater a fiber optic cable is bent below its minimum bend radius, the greater the potential for breaking the fibers contained in the cable, and the shorter the life span of the cable.

Furthermore, the recent increase in bandwidth requirements for telecommunications systems has resulted in more densely packed equipment and fiber optic cables than prior systems. Many carriers or other consumers of optical communications equipment have a very limited floor space in which to place new equipment and fiber optic cables. For example, some carriers may only have a single open bay (or shelf) in which to place new equipment and fiber optic cables. If the communications equipment can be more densely packed, then a greater amount of equipment and fiber optic cables may be placed within the available space. Thus, it is even more necessary now to be able to bend fiber optic cables around corners and other obstacles in order to route the cables to and from equipment such as computers, connector panels, junction boxes, etc.

For example, in a telephone switching office, the various switching components are split onto different printed circuit boards (PCBs). Fiber optic cables may be used to route the signals between the different PCBs or between components on a single PCB. In a conventional arrangement, the PCB is generally placed in a shelf or rack alongside other such PCBs.

The fiber optic cables are used for transferring signals between reception ports and electro-optical converters provided on the PCB or PCBs. The fiber optic cables generally come in three and six foot lengths with connectors provided at the ends thereof. However, the PCB may have a width of only several inches. To accommodate for the extra length of the fiber optic cables, such cables are routed around and secured to the PCB via a plurality of clips. The clips are secured to the PCB via holes drilled through the PCB.

The fiber optic cables are generally routed, by hand, through the clips, without bending the fiber optic cables beyond the minimum bend radius. Whether this requirement is satisfied depends on the individual operator doing the assembly. The fiber optic cables ideally should be routed in to prevent stress being applied to the cables.

Unfortunately, conventional clips increase the stress applied to the cables. They are made of hard materials, and are always either open, locked closed, or gated. Rigid closed or gated clips may break or damage the fiber optic cable when the cable is forced into or pinched by such clips. Rigid open clips do not present such a problem, but typically hold only a single cable and fail to adequately retain the cable in the clip. Furthermore, conventional clips are often difficult to use, and too large and generic to work in new, denser communications systems.

Thus, there is a need in the art to provide an inexpensive closed means for securing and routing multiple fiber optic cables in the denser optical communications systems that may be easily customized by an operator and prevent the fiber optic cables from being damaged or bent beyond their minimum bend radii.

SUMMARY OF THE INVENTION

The present invention solves the problems of the related art by providing a fiber optic cable saddle for securing and routing fiber optic cables on a printed circuit board (PCB) or other component used in the communications field. The fiber optic cable saddle completely encloses the cables, is easy to use, and is does not damage the cables when installing the cables within the saddle. If the fiber optic cable is pulled when contained within the saddle, the fiber optic cable saddle will flex and release the cable before the cable is damaged.

In accordance with the purpose of the invention, as embodied and broadly described herein, the invention comprises a fiber optic cable saddle having: a spiral-shaped body portion having a first end radially disposed within a second end; and an attachment mechanism connected to the spiral-shaped body portion.

Further in accordance with the purpose of the invention, as embodied and broadly described herein, the invention comprises a method of using a fiber optic cable saddle having a spiral-shaped body portion having a first end radially disposed within a second end, and an attachment mechanism connected to the spiral-shaped body portion, comprising: attaching to the fiber optic cable saddle to a surface with the attachment mechanism; flexing the spiral-shaped body portion into an open position; placing a fiber optic cable or a plurality of fiber optic cables within the flexed-open body portion; and releasing the flexed-open body portion to return the body portion to a spiral shape.

Still further in accordance with the purpose of the invention, as embodied and broadly described herein, the invention comprises a cable saddle having: a spiral-shaped body portion having a first end radially disposed within a second end; and an attachment mechanism connected to the spiral-shaped body portion.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description. It is to be understood that both the foregoing general description and the following detailed description are exemplary and explanatory only and are not restrictive of the invention, as claimed.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 1 is a perspective view of a fiber optic cable saddle in accordance with an embodiment of the present invention;

FIG. 2 is a side elevational view of the fiber optic cable saddle shown in FIG. 1 mounted to a PCB board and holding fiber optic cables;

FIG. 3 is a front elevational view of the fiber optic cable saddle shown in FIGS. 1 and 2;

FIG. 4 is a side elevational view of a fiber optic cable saddle in accordance with another embodiment of the present invention;

FIG. 5 is a side elevational view of a fiber optic cable saddle (shown in a closed position) in accordance with still another embodiment of the present invention; and FIG. 6 is a side elevational view of the fiber optic cable saddle shown in FIG. 5 and in an open position.

DETAILED DESCRIPTION OF THE PREFERRED EMBODIMENTS

The following detailed description of the invention refers to the accompanying drawings. The same reference numbers in different drawings identify the same or similar elements. Also, the following detailed description does not limit the invention. Instead, the scope of the invention is defined by the appended claims and equivalents thereof.

Referring now specifically to the drawings, one embodiment of the fiber optic cable saddle of the present invention is illustrated in FIGS. 1–3, and shown generally as reference numeral 10. Fiber optic cable saddle 10 includes a body portion 12 connected to a post 14 having a barb 16 at one end. Post 14 and barb 16 may be separate components from body portion 12, but preferably, body portion 12, post 14, and barb 16 are all integrally formed.

Fiber optic cable saddle 10 may be formed from numerous materials, but preferably is formed from a soft, resilient material that permits body portion 12 to flex open and return back to its original shape. Such resilient materials may include, for example, a rubber (natural or synthetic) material, a soft plastic material, or a recycled soft plastic material. Preferably, a low durometer hardness nylon material is used for the body portion 12. A spring steel material may also be used for more rugged cables.

The body portion 12 of fiber optic cable saddle 10 has several geometric features, described below, which in conjunction with the forming process and material properties, apply stress to the outer surface of body portion 12. The applied stress helps make body portion 12 of saddle 10 self-closing.

As shown in FIGS. 2 and 3, the profile of body portion 12 is a thin, closely spaced spiral. Body portion 12 has a pair of ribs 18 provided on an outer surface thereof to provide strength and support thereto. Another rib 20 is provided on the inner surface of body portion 12. Rib 20 receives and interlocks with a recess formed in body portion 12, as described below. The outer surface of body portion 12 further includes a first recess 22 and a second recess 24, and the inner surface of body portion 12 includes a third recess 26. Third recess 26 acts like a hinge to bias saddle 10 closed. Each of the free ends of body portion 12 has a cylindrical projection integrally formed thereon. A first cylindrical projection 28 extends from one free end of body portion 12, and a second cylindrical projection 30 extends from the other free end of body portion 12.

In addition to aiding the self-closing nature of saddle 10, recesses 22, 24, 26 permit molding clearance between the end portions of saddle 10. Depending upon what material and process are used to form saddle 10, ribs 18, 20 may be formed on the inner or outer surface of saddle 10. Ribs 18, 20 and projections 28, 30 serve several functions. They provide tension to the surfaces of body portion 12; provide surfaces for mold ejector pins to allow saddle 10 to be more easily removed from the mold; provide obstacles so the cable cannot easily escape the saddle 10; and provide strength and stability to the saddle 10. The ribs 18, 20 may be placed at different locations to modify the flexure of the saddle 10 in an open or closed position.

In the embodiment of the present invention shown in FIG. 2, the locations of the ribs and cylindrical projections of fiber optic cable saddle 10 are as follows. Assuming first cylindrical projection 28 is located at zero (0) and one moves counterclockwise about the spiral, ribs 18 are located ninety (90) degrees and two-hundred and twenty-five (255) degrees from projection 28, rib 20 is located two-hundred and seventy (270) degrees from projection 28, and second cylindrical projection 30 is located four-hundred and eighty-eight (488) degrees from projection 28.

As further shown in FIGS. 2 and 3, post 16 extends through an opening 102 provided in a communication component, such as a PCB 100. Barb 16 may have a shoulder portion 32 which is slightly larger than opening 102, and a frustoconical-shaped portion 34 extending away from shoulder portion 32. Fiber optic cable saddle 10 may be mounted in PCB 100 by forcing barb 16 into opening 102, until shoulder portion 32 engages a bottom surface of PCB 100. Post 14 resides in opening 102, and shoulder portion 32 and the outer surface of body portion 12 hold fiber optic cable saddle 10 firmly against PCB 100. The length of post 14 thus may vary depending upon the thickness of the communication component or PCB 100. For example, post 14 may have thickness of 0.093 or 0.062 inches.

Although only a single post 14 and barb 16 are shown in FIGS. 1–4, more than one post 14 and barb 16 may be used with the present invention, depending upon the size of saddle 10 and the desired stability for saddle 10. Post 14 and barb 16 may be replaced with other attachment means. For example, glue or double-sided tape may be used to attach body portion 12 to PCB 100. Furthermore, saddle 10 may be mounted to surfaces other than PCB 100. For example, fiber optic cable saddle 10 may attach to any surface having a hole capable of accepting post 14 and barb 16, or any surface otherwise capable of accepting the particular attachment mechanism used.

FIGS. 2 and 3 show fiber optic cable saddle 10 in a closed position. In the closed position, first recess 22 receives and frictionally contacts first cylindrical projection 28, second recess 24 receives and frictionally contacts rib 20, and third recess 26 receives and frictionally contacts second cylindrical projection 30. In the closed position, a plurality of fiber optic cables 104 may be secured within body portion 12 of fiber optic cable saddle 10. The dimensions of body portion 12 may vary depending upon the desired number of fiber optic cables 104 to be routed therethrough, as well as the types of fiber optic cables 104. For example, only a few large diameter fiber optic cables may be provided within body portion 12 of saddle 10, whereas more smaller diameter fiber optic cables may be provided within the same body portion 12.

Another embodiment of the fiber optic cable saddle of the present invention is illustrated in FIG. 4, and shown generally as reference numeral 10'. Saddle 10' includes the same components as saddle 10, including a body portion 12' integrally connected to a post 14 and barb 16. Body portion 12' includes the same elements as body portion 12 of saddle 10, except that the locations of a third recess 26' and a rib 18' are modified. In the closed position shown in FIG. 4, rib 18' is located less than one-hundred and eighty degrees from the location of first recess 22, and third recess 26' receives and frictionally contacts second cylindrical projection 30 at approximately one-hundred and eighty degrees from the location where first recess 22 receives and frictionally contacts first cylindrical projection 28. Thus, saddle 10' shown in FIG. 4 is more tightly coiled (or spiraled) than saddle 10 shown in FIGS. 1–3.

Still another embodiment of the fiber optic cable saddle of the present invention is illustrated in FIG. 5, and shown generally as reference numeral 10". Saddle 10" includes the same components as saddle 10', but further includes an additional rib 21 that mates with an additional recess 23. Rib 21 and recess 23 may be located approximately forty-five (45) degrees from first cylindrical projection 28.

Before securing fiber optic cables within saddle 10, 10', 10", a user will preferably mount saddle 10, 10', 10" on PCB 100. Once fiber optic cable saddle 10, 10', 10" is mounted in PCB 100, the user opens saddle 10, 10', 10" by flexing a section of body portion 12 so that a space forms between the ends of body portion 12. An example of the saddle in an open position is shown in FIG. 6. With body portion 12 in this open position, the user then places the fiber optic cable(s) 104 against the inner surface of body portion 12, and then ceases flexure of the section of body portion 12. This allows fiber optic cable saddle 10, 10', 10" to relax and coil around fiber optic cable(s) 104, holding them in place.

The fiber optic cable saddle of the present invention provides many advantages over the conventional clips previously described. For example, the saddle of the present invention is easy to use since it is self-closing and naturally wraps around the fiber optic cable when a user ceases flexure of the body portion. Furthermore, the saddle of the present invention is preferably soft and flexible so it does not damage the fiber optic cable.

It will be apparent to those skilled in the art that various modifications and variations can be made in the fiber optic cable saddle of the present invention and in construction of the saddle without departing from the scope or spirit of the invention. The physical dimensions, angle and degree ranges, number of ribs and recesses, shape of the ribs and recesses, rotation of the spiral, material selections, etc., discussed above and shown in the FIGS., are purely exemplary and not limiting of the embodiments of the present invention. Furthermore, the present invention is not limited to use with fiber optic cables, and may be used with any cable, such as, for example, telephone cable having a plurality of copper conductors, coaxial cable, or the like.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A fiber optic cable saddle comprising:

a spiral-shaped body portion having a first end radially disposed within a second end, said spiral-shaped body portion having geometrical and material properties that act to provide a self-closing action that closes said spiral-shaped body portion without the application of an external force so as to enclose and retain a fiber optic cable without causing substantial damage to the fiber optic cable; and an attachment mechanism connected to said spiral-shaped body portion, wherein the geometrical properties of said spiral-shaped body portion include at least one rib provided on and applying stress to its outer surface to provide the self-closing action, wherein when said spiral-shaped body portion is flexed into an open position and then released, said spiral-shaped body portion returns to a spiral shape via the self-closing action.

2. A fiber optic cable saddle as recited in claim 1, wherein said spiral-shaped body portion has at least one rib provided on its inner surface.

3. A fiber optic cable saddle as recited in claim 1, wherein said spiral-shaped body portion has at least one rib provided on its inner surface, and at least one rib provided on its outer surface.

4. A fiber optic cable saddle as recited in claim 1, wherein the first end of said spiral-shaped body portion has a cylindrical projection.

5. A fiber optic cable saddle as recited in claim 1, wherein the second end of said spiral-shaped body portion has a cylindrical projection.

6. A fiber optic cable saddle as recited in claim 1, wherein the first end of said spiral-shaped body portion has a first cylindrical projection, and the second end of said spiral-shaped body portion has a second cylindrical projection.

7. A fiber optic cable saddle as recited in claim 6, wherein the first and second cylindrical projections are at least partially disposed within corresponding recesses formed in said spiral-shaped body portion.

8. A fiber optic cable saddle as recited in claim 2, wherein the first end of said spiral-shaped body portion has a first cylindrical projection, and the second end of said spiral-shaped body portion has a second cylindrical projection.

9. A fiber optic cable saddle as recited in claim 8, wherein the first and second cylindrical projections and the at least one rib are at least partially disposed within corresponding recesses formed in said spiral-shaped body portion.

10. A fiber optic cable saddle as recited in claim 1, wherein said spiral-shaped body portion and said attachment mechanism are integrally connected.

11. A fiber optic cable saddle as recited in claim 1, wherein the material properties of said spiral-shaped body portion include constructing said spiral-shaped body portion with a resilient material.

12. A fiber optic cable saddle as recited in claim 11, wherein the resilient material comprises natural or synthetic rubber, or nylon.

13. A fiber optic cable saddle as recited in claim 1, wherein the material properties of said spiral-shaped body portion permits said spiral-shaped body portion to flex into an open position for receiving at least one fiber optic cable, and wherein the material and geometrical properties cause said spiral-shaped body portion to return back to its original spiral shape in a self-closing action.

14. A fiber optic cable saddle as recited in claim 1, wherein a fiber optic cable or a plurality of fiber optic cables are secured within said spiral-shaped body portion.

15. A fiber optic cable saddle as recited in claim 1, wherein said attachment mechanism is received in a surface of an optical communications device.

16. A fiber optic cable saddle as recited in claim 1, wherein said attachment mechanism is received in a surface of a printed circuit board.

17. A fiber optic cable saddle as recited in claim 1, wherein said attachment mechanism comprises a post connected at one end thereof to said spiral-shaped body portion, and a barb connected to another end of the post.

18. A fiber optic cable saddle as recited in claim 1, wherein the geometrical properties of said spiral-shaped body portion include at least one recess on its inner surface that provide the self-closing action.

19. A method of using a fiber optic cable saddle having a spiral-shaped body portion having a first end radially disposed within a second end, and an attachment mechanism connected to the spiral-shaped body portion, the spiral-shaped body portion having geometrical and material properties that act to provide a being self-closing action that closes said spiral-shaped body portion without the application of an external force so as to enclose and retain a fiber optic cable without causing substantial damage to the fiber optic cable, comprising:

attaching the fiber optic cable saddle to a surface with the attachment mechanism;

flexing the spiral-shaped body portion into an open position;

placing a fiber optic cable or a plurality of fiber optic cables within the flexed-open body portion; and releasing the flexed-open body portion to return the body portion to a spiral shape via the self-closing action, wherein said spiral-shaped body portion has at least one rib provided on and applying stress to its outer surface to make said spiral-shaped body portion self-closing.

* * * * *